(12) United States Patent
Adams et al.

(10) Patent No.: US 11,681,166 B2
(45) Date of Patent: Jun. 20, 2023

(54) ELECTRO-ABSORPTION OPTICAL MODULATOR INCLUDING GROUND SHIELD

(71) Applicant: II-VI Delaware, Inc., Wilmington, DE (US)

(72) Inventors: David Adams, Stockholm (SE); Andrei Kaikkonen, Jarfalla (SE); Nicolae Chitica, Kista (SE)

(73) Assignee: II-VI Delware, Inc., Wilmington, DE (US)

( * ) Notice: Subject to any disclaimer, the term of this patent is extended or adjusted under 35 U.S.C. 154(b) by 237 days.

(21) Appl. No.: 17/082,425

(22) Filed: Oct. 28, 2020

(65) Prior Publication Data

US 2022/0128843 A1    Apr. 28, 2022

(51) Int. Cl.
| | | |
|---|---|---|
| *H01S 5/026* | (2006.01) | |
| *G02F 1/015* | (2006.01) | |
| *H01S 5/12* | (2021.01) | |
| *H01S 5/06* | (2006.01) | |
| *G02F 1/025* | (2006.01) | |

(52) U.S. Cl.
CPC .............. *G02F 1/015* (2013.01); *H01S 5/026* (2013.01); *H01S 5/0601* (2013.01); *H01S 5/124* (2013.01); *G02F 1/0157* (2021.01); *G02F 1/025* (2013.01); *G02F 2202/102* (2013.01); *G02F 2202/108* (2013.01); *H01S 5/0265* (2013.01)

(58) Field of Classification Search
CPC ........ G02F 1/057; H01S 5/026; H01S 5/0265; H01S 5/0601
See application file for complete search history.

(56) References Cited

U.S. PATENT DOCUMENTS

| | | | | |
|---|---|---|---|---|
| 5,481,559 A | * | 1/1996 | Kawamura | ........... H01S 5/3213 372/50.1 |
| 6,191,464 B1 | * | 2/2001 | Barnard | .............. H01S 5/04256 257/427 |
| 6,917,055 B2 | * | 7/2005 | Stegmuller | ............ B82Y 10/00 257/85 |

* cited by examiner

*Primary Examiner* — Michael Carter
(74) *Attorney, Agent, or Firm* — Wendy W. Koba

(57) ABSTRACT

A wideband electro-absorption modulating (EAM) device is configured to include a ground shield that functions to minimize the spread of an applied AC voltage beyond the limits of the modulator's electrode. The ground shield includes a grounding electrode disposed in a spaced-apart relationship with the modulator electrode along the ridge of the EAM structure, and a grounding termination used to couple the grounding electrode to a suitable ground location. The ground location may be either on-chip (such as the DC ground of the modulator itself) or off-chip (via an off-chip capacitor, with a wirebond connecting the grounding electrode to the capacitor). The use of a ground shield mitigates the effects that changes in the data rate have on effective length of the modulator as seen by the applied data signal.

11 Claims, 10 Drawing Sheets

ELECTRO-ABSORPTION OPTICAL MODULATOR INCLUDING GROUND SHIELD

TECHNICAL FIELD

The present invention relates to an electro-absorption optical modulator (EAM) typically used in conjunction with a laser structure to create an externally modulated laser (EML) and, more particularly, to the inclusion of a ground shield within the EAM configuration to improve the frequency response of the EAM and extend the operating bandwidth of the EML.

BACKGROUND OF THE INVENTION

One type of optical communication system that is particularly well-suited for the transmission of today's high-speed data rate signals is based upon the use of an electro-absorption modulated laser (EML). A continuous wave (CW) optical beam is emitted by a light source and then modulated by an external electrical signal (high frequency) representative of the data to be transmitted. In particular, an electro-absorption modulator (EAM) is positioned to receive both the CW output from the light source and the electrical HF modulation data. The EAM is configured to modulate the CW light and generate as an output a modulated optical signal.

One limitation to the performance of an EML is the frequency response of the EAM component. If the frequency response exhibits a limited 3 dB bandwidth, the upper practical limit of the modulation rate of the incoming electrical signal is limited as well, where increases of the modulation rate result in injecting errors in the transmitted optical output data signal. While problematic for high frequency portions of a data signal stream, low frequency portions, where the data includes a long string of 0's or 1's, may also be impacted by the frequency response of the EAM.

Thus, it is desirable to flatten the modulation response of an EAM over a broad range of frequencies that is anticipated to be of interest for optical communication systems.

SUMMARY OF THE INVENTION

The present invention is related to improving the frequency response of an electro-absorption modulator (EAM) and, more particularly, to the creation of a wideband EAM by the inclusion of a ground shield in close proximity to the modulating device that functions to minimize the spread of the applied AC voltage beyond the limits of the modulator's electrode. The use of a ground shield mitigates the effects that changes in the data rate have on effective length of the modulator as seen by the applied data signal.

In accordance with the principles of an exemplary embodiment of the present invention, a ground shield is disposed just beyond an end termination of the EAM modulation electrode, creating a clamping boundary for the longitudinal spread of the AC voltage applied as the input data signal to the modulator electrode. The ground shield comprises a grounding electrode disposed in a spaced-apart relationship with the modulator electrode along the waveguide of the EAM structure, and a grounding termination used to couple the grounding electrode to a suitable ground port. The ground port location may be either on-chip (such as the DC grounded substrate of the modulator itself) or off-chip (via an off-chip capacitor, with a wirebond connecting the grounding electrode to the capacitor). The grounding termination itself may include an inductive element and/or an RC network to further modify and extend the frequency response of the inventive EAM.

In configurations where the modulator electrode is positioned along an interior portion of the an optical circuit, a pair of ground shields may be used, one positioned adjacent to each end termination of the modulator electrode. In configurations where one modulator termination is adjacent to the chip output facet, a single ground shield electrode may be disposed at the termination of the modulator electrode that is situated toward the interior side of the optical circuit.

Various exemplary embodiments of the present invention may utilize a grounding plane other than the DC ground (substrate) of the EAM device itself. The grounding electrode in these embodiments may be coupled to an external capacitor (either directly or through an on-chip RC network), which may extend the bandwidth over which the EAM exhibits a linear response. In configurations where the EAM is used in combination with a phase-shifted distributed feedback laser (DFB), the grounding electrode may be coupled to an electrode positioned on the anode beyond the rear termination of the DFB to serve as the grounding structure.

An exemplary embodiment of the present invention may take the form of wideband electro-absorption optical modulating device including a substrate of a first conductivity type, the substrate defined as comprising a top major surface and an electro-absorption modulating device formed along a longitudinal extent of the substrate, the electro-absorption modulating device including an active region and an upper cladding layer of a second conductivity type disposed over the active region, the active region configured to receive an incoming continuous wave (CW) optical beam and generate an optically modulated output signal therefrom by virtue of a modulator electrode disposed over an extended portion of the upper cladding layer situated above the active region and responsive to the application of an AC voltage-based input modulating signal to impart modulations to the propagating CW optical beam so as to create the optically modulated output signal. The modulating device also includes a ground shield disposed adjacent to an end termination of the modulator electrode and coupled to a ground plane, the ground shield reducing migration of the applied AC voltage beyond the opposing end termination of the modulator electrode.

Other and further aspects and features of the present invention will become apparent during the course of the following discussion and by reference to the accompanying drawings.

BRIEF DESCRIPTION OF THE DRAWINGS

Referring now to the drawings where like numerals represent like parts in several views.

DETAILED DESCRIPTION

Figure 1:
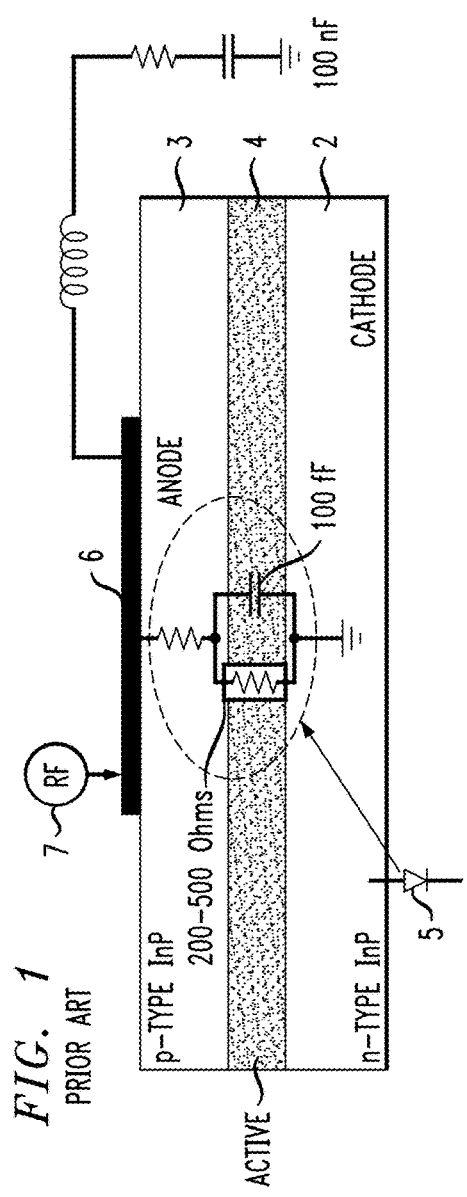
FIG. 1 is diagrammatic illustration of a prior art EAM, illustrating the sources of frequency-based response limitations.

Referring to FIG. 1, an exemplary prior art electro-absorption modulator (EAM) 1 is depicted as a capacitive structure that functions to absorb photons within a semiconductor active region, converting the absorbed photons into free electron-hole pairs via the Franz-Keldysh effect (or the Quantum Confined Stark effect, as a function of the type of active region included in the modulator). That is, the application of a modulated electrical signal to the anode of the structure functions to transform a propagating CW optical wave into a modulated output optical signal. Here, EAM 1 is shown as comprising an n-type InP substrate 2 that is separated from a p-type InP layer 3 by an active region 4 that comprises one or more intrinsic layers having a lower bandgap than InP, such as an InGaAsP or an InGaAlAs multiple quantum well (MQW) epitaxial layer sequence. The combination of these semiconductor regions thus forming the modulator's diode structure 5. An electrode 6 is disposed over a portion of p-type InP layer 3 and used to supply the electrical input data signal (i.e., the AC voltage input) from an input RF source 7 to EAM 1.

Figure 2:
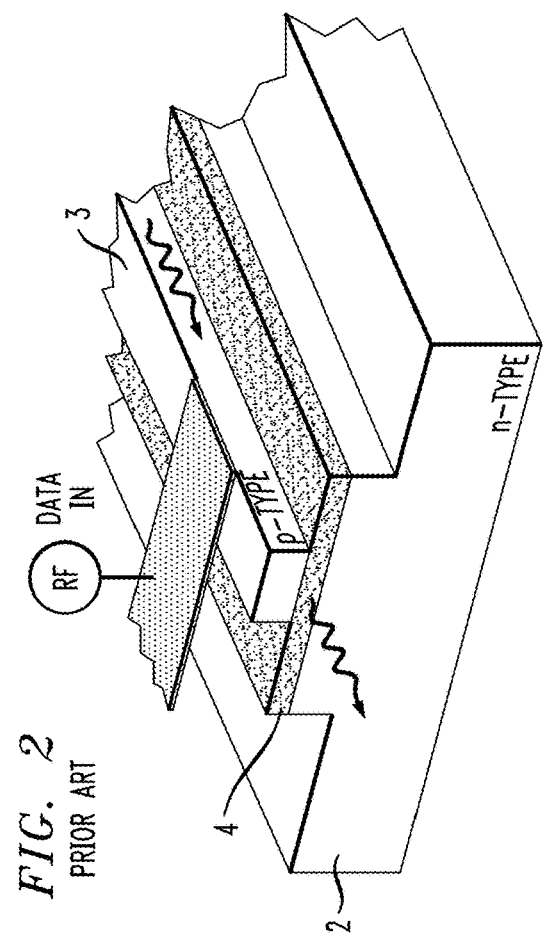
FIG. 2 is an isometric view of the prior art EAM of FIG. 1.

FIG. 2 is an isometric view of prior art EAM 1, which is shown as exhibiting a ridge waveguide structure, where p-type InP anode layer 3 defines the ridge. Active region 4 and an upper portion of n-type InP layer 2 are formed to exhibit a "mesa" structure below the ridge structure of p-type InP anode layer 3, with the remainder of n-type InP layer 2 forming the substrate of the device.

The frequency response of prior art EAM 1 is controlled by several factors, including the RC value of diode structure 5. The effective resistance of this structure under optical illumination (also referred to at times as its photo-resistance) may be on the order of 200-500Ω, with a parallel capacitance on the order of 100 fF (femto Farads). Electrical signal reflection challenges also arise from an impedance mismatch between the III-V materials (here, InP) used to form EAM 1 and the typical 50Ω output impedance drive circuitry connected to electrode 6. Typically, a termination resistor is utilized to provide adequate impedance matching over a suitable modulator frequency range.

Regarding the mitigation of the problem of a change in the effective length of the modulator at different modulation frequencies, some prior art approaches have utilized a separately-grown passive waveguide that is disposed between the laser and modulator or, alternatively, employed a selective area growth enhancement technique to obtain a combination of active and passive modulator material in a single epitaxial process step. However, these approaches entail significant cost and complications to the standard fabrication process, and/or introduce some risk in the targeting of the modulation material composition and quality.

Figure 3:
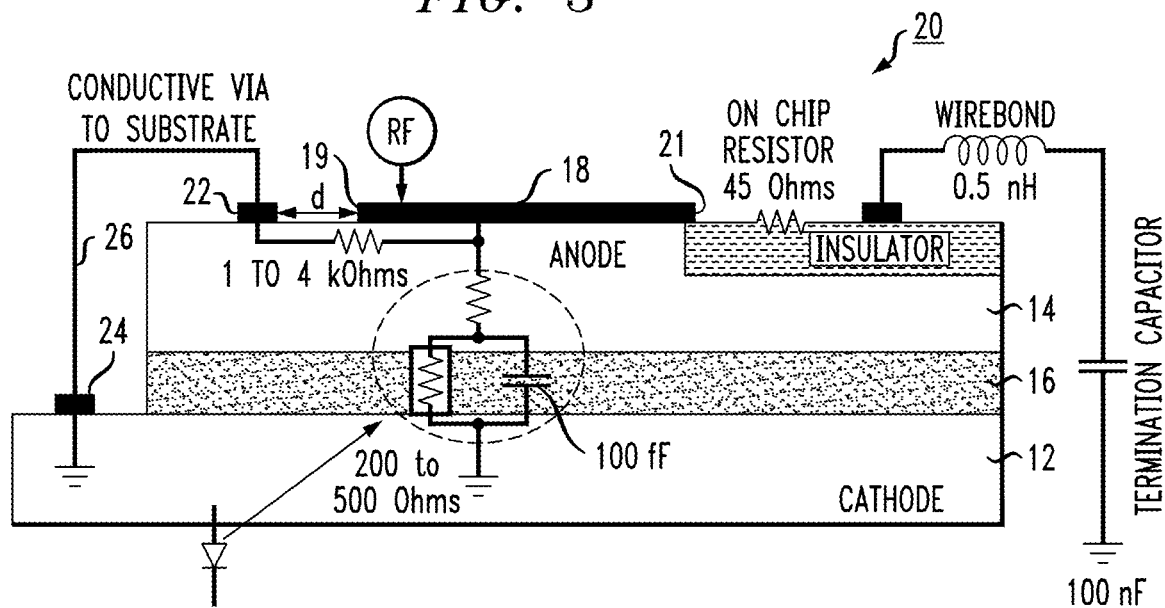
FIG. 3 is a diagrammatic illustration an EAM formed in accordance with the present invention to include a ground shield structure to minimize migration of the applied AC voltage.
Figure 4:
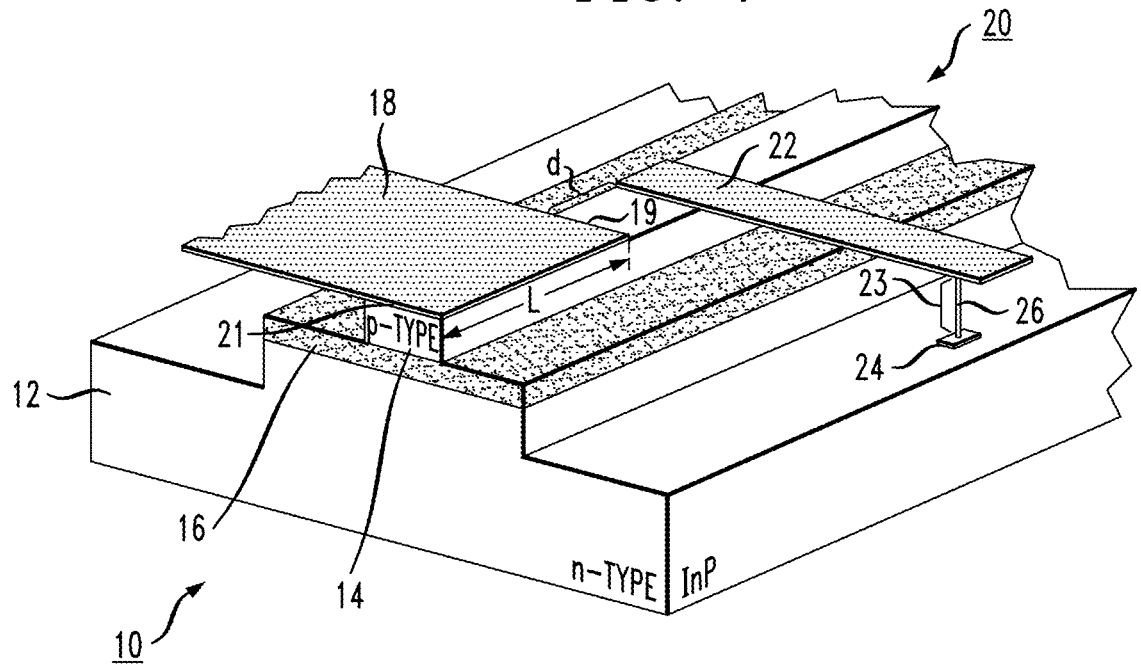
FIG. 4 is an isometric view of an exemplary embodiment of an EAM formed in accordance with the present invention.

FIG. 3 is a diagrammatic depiction an exemplary wide-band EAM 10 formed in accordance with the present invention to exhibit a relatively flat modulation response over a broad frequency range by the inclusion of at least one external ground shield 20 with the EAM structure. FIG. 4 is an isometric view of EAM 10, which for the purposes of clarity does not illustrate an associated light source (that may be formed on the same substrate, as discussed above, or may comprise a separate CW source that is optically coupled to EAM 10). The view of FIG. 3 is to be interpreted as an illustration of the functionality of the inventive ground shield; an active physical embodiment would take the form such as shown in FIG. 4.

As will be discussed in detail below, the inclusion of a ground shield in accordance with the principles of the present invention confines the longitudinal extent of the AC voltage applied to the modulator electrode (i.e., the modulating data signal) to an area within close proximity of the physical boundaries (end terminations) of the modulator electrode itself. The ability to confine migration of the applied AC voltage minimizes changes in the effective length of the modulator that would otherwise occur as the data rate of the input signal changes, thus providing a more uniform frequency response over a wider frequency range of the inventive EAM with respect to prior art devices.

The electro-absorption features of EAM 10 are similar to those discussed above with prior art EAM 1; namely, EAM 10 comprises an n-type InP substrate 12 that is equated to the cathode of the device, with a p-type InP ridge (anode) 14 disposed over n-type substrate 12 and separated therefrom by an active region 16 (which may comprise an MQW structure). As before, a majority of the propagating lightwave energy is confined to active region 16. A modulator electrode 18 is formed over a portion of p-type ridge 14 and is used to supply the modulating electrical signal input to EAM 10. The physical length L of modulator electrode 18 along ridge 14 is shown in FIGS. 3 and 4.

While EAM 10 is illustrated in FIG. 4 as having a ridge waveguide structure similar to that of the prior art arrangement shown in FIG. 2, it is to be understood that the ground shield of the present invention may be used with any other type of EAM structure; that is, structures which maintain confinement of the propagating optical beam within the active region (and local proximity) of the modulating device to create a waveguiding arrangement. For example, in the case of an EAM formed to exhibit a buried hetero-structure geometry, a ground shield can be disposed on the mesa structure that typically encapsulates the waveguide, and which typically includes a p-doped contact region on the top of the mesa.

The drive signal voltage applied to modulator electrode 18 is typically a "mixed" signal containing high frequency data stream portions (associated with a rapid change between digital 0's and 1's) and relatively low frequency portions (associated with a long string of data bits having the same logic value). During a low frequency stretch of data transmission, the voltage applied to modulator electrode 18 has an extended period of time to migrate within p-type ridge 14 beyond end terminations 19, 21 of electrode 18. Without the inclusion of ground shield 20, the presence of this migrated voltage would introduce a reverse bias to active region 16 within portions of the waveguide beyond modulator electrode terminations 19, 21, and thereby introduce unwanted changes to the propagating optical signal. Indeed, since the spread of the applied voltage is a function of the frequency of the applied signal, the result is an unwanted frequency dependence on the accuracy of the transmitted data. Said another way, the voltage spread away from modulator electrode 18 changes the "effective length" $L_{eff}$ of the modulator as experienced by the propagating CW optical signal, with the optical signal applied to the EAM during a period of low frequency data propagating through a "longer" modulator than during periods of high frequency data.

In accordance with the principles of the present invention, EAM 10 further comprises a ground shield 20 that is disposed in close proximity to an end termination of modulator electrode 18 and used to clamp the voltage spread in a manner that substantially maintains a constant effective length of the modulator regardless of the incoming data rate. In the particular embodiment shown in FIGS. 3 and 4, ground shield 20 comprises a grounding electrode 22 disposed on p-type InP ridge 14 at a location that is spaced apart from an end termination 19 of modulator electrode 18. Here, grounding electrode 22 is shown as spaced a distance d from termination 19 of modulator electrode 18. Ground shield 20 further comprises a grounding termination 23, in this case in the form of a ground contact pad 24 disposed on a surface of n-type InP substrate 12 and a conducting element 26 extending between grounding electrode 22 and ground contact pad 24. Inasmuch as n-type substrate 12 forms the DC ground of the integrated structure, the presence of ground shield 20 thus functions to clamp the voltage potential between "anode" 14 and "cathode" 12 to ground. It is to be noted that the clamping of anode 14 to ground occurs at grounding electrode 22 and within its immediate vicinity, such that the highly resistive section of the waveguide situated between ground shield 20 and modulator electrode 18 permits the application of arbitrary voltages to modulator electrode 18 without shorting that electrode voltage level to ground.

As best represented in the view of FIG. 4, conducting element 26 comprises a conductive via that extends downward from grounding electrode 22, passing through dielectric material 25 surrounding EAM 10 to reach ground contact pad 24. In an exemplary embodiment, conducting element 26 may comprise a pillar of a highly conductive material, such as gold.

In accordance with the principles of the present invention, ground shield 20 functions as a boundary that confines the spread of the applied modulation voltage to the proximity of modulator electrode 18. The inclusion of ground shield 20 thus reduces the change in the effective length $L_{eff}$ of the modulator's transmission line associated with changes in data rate that occur within the applied AC voltage such that both "low frequency" portions of the applied AC voltage and "high frequency" portions "see" a modulator transmission line of substantially the same length. As a result, the inclusion of ground shield 20 reduces transmission impairments when compared to prior art modulators by flattening the modulation response of EAM 10 over a broad range of frequencies.

Inasmuch as the particular configuration of FIG. 4 locates end termination 21 of modulator along (or very close to) an endface of the semiconductor structure, there is a need for only a single ground shield to improve the frequency response of the EAM (since the applied AC voltage is inherently clamped at the opposing endface termination).

Figure 5:
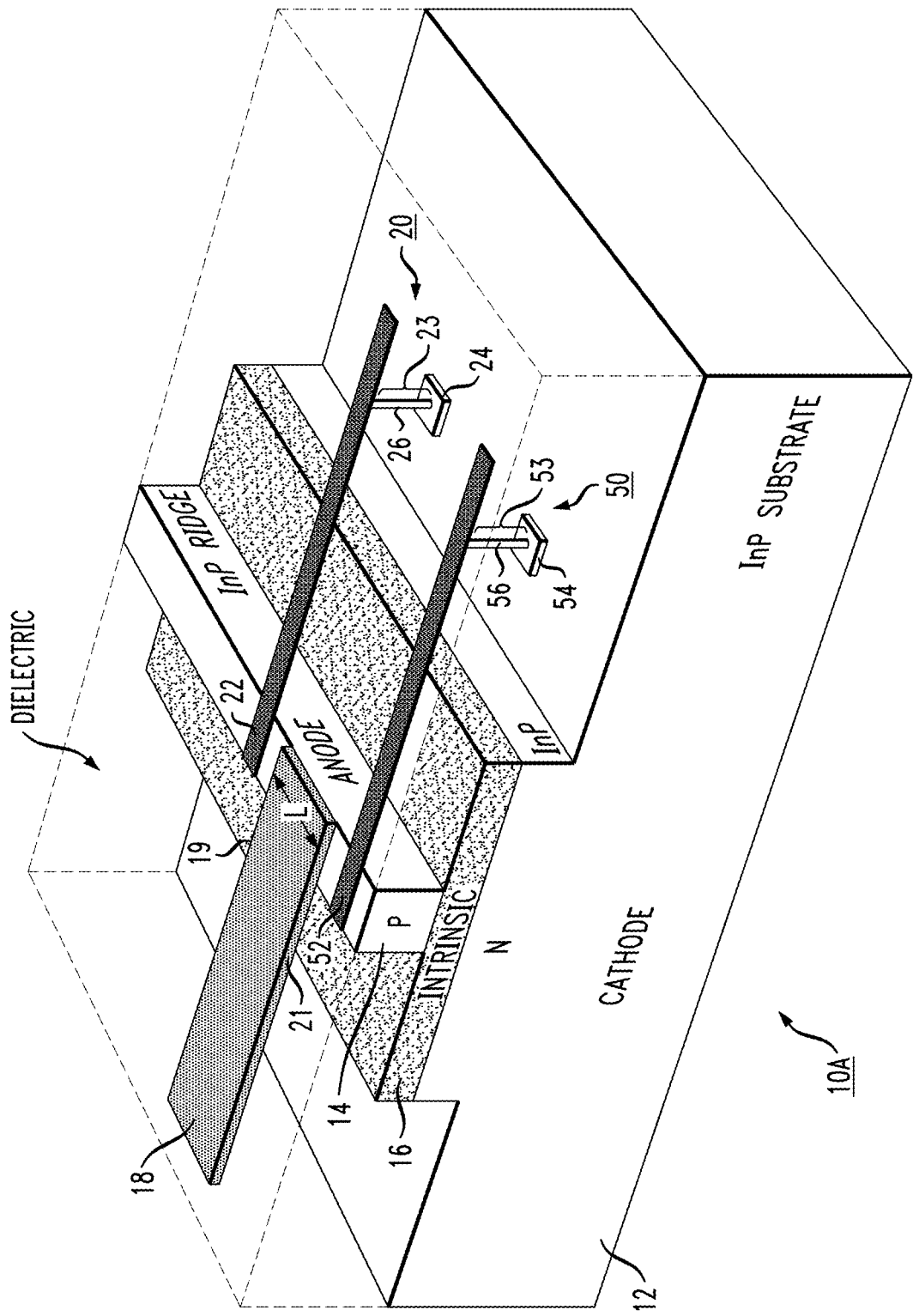
FIG. 5 is an isometric view of an alternative embodiment of the present invention, in this arrangement using a pair of ground shields, located at either end of the modulator's transmission line.

However, for embodiments where the EAM is positioned along an interior portion of the structure, it is also possible to position a second ground shield in a spaced-apart relationship with the opposite end termination of modulator electrode 18 (here, end termination 21). FIG. 5 illustrates an alternative embodiment of the present invention, referred to as EAM 10A, depicting such a structure that utilizes a pair of ground shields to confine the longitudinal extent of the applied AC voltage to the immediate vicinity of modulator electrode 18.

EAM 10A is shown as comprising the same modulator elements as discussed above in association with EAM 10 of FIG. 3, as well as the same ground shield 20 disposed beyond end termination 19 of modulator electrode 18. In accordance with this embodiment of the present invention, EAM 10A further comprises a second ground shield 50 positioned beyond the opposing end termination 21 of modulator electrode 18. Similar to ground shield 20, second ground shield 50 includes a grounding electrode 52 disposed on p-InP ridge 14 at a spaced-apart location from end termination 21 of modulator electrode 18, as well as a grounding termination 53 consisting of a ground contact pad 54 disposed on a surface area of n-type InP substrate 12, with a conductive element 56 used to couple electrode 52 to ground contact pad 54. This combination of grounding electrode 52 and grounding termination 53 functions to form a ground "clamp" on this side of EAM 10A, thus further confining the applied voltage to remain within the boundaries of modulator electrode 18.

In accordance with the principles of the present invention, an inductive element may be included within the ground shield structure to add a frequency response characteristic to the ground shield that assists in further extending the frequency response on the high-frequency end of the applied modulating signal. In particular, the impedance introduced by an inductive element functions to diminish the "clamping" function at very high frequencies to mitigate the conventional roll-off in modulation bandwidth that is otherwise typical at very high frequencies. In other words, this impedance has the benefit of making the modulator effective length moderately longer at those frequencies where the modulation response would normally be diminished by conventional RC-circuit frequency roll-off.

Figure 6:
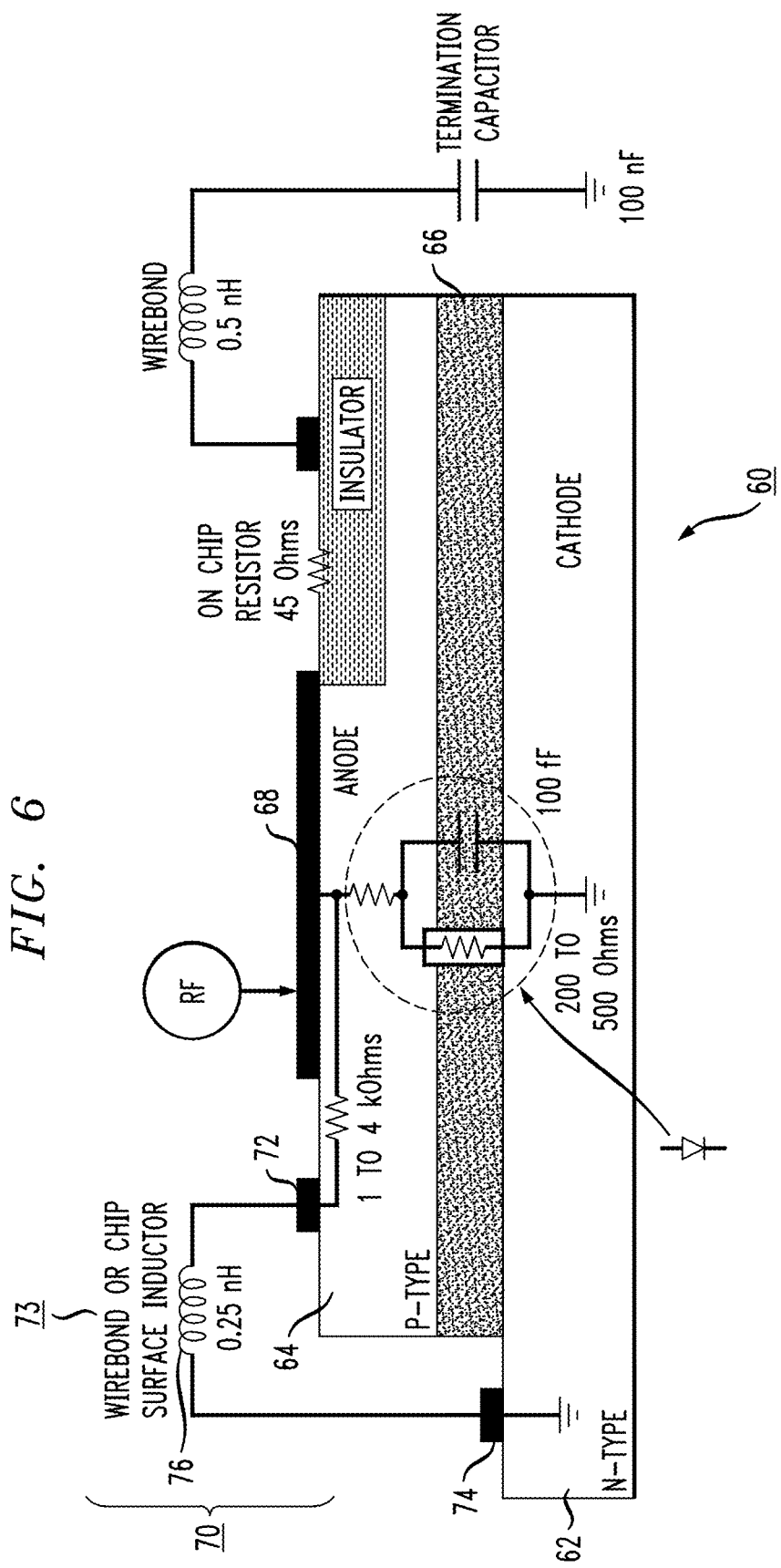
FIG. 6 is a diagrammatic illustration of another embodiment of the present invention, in this case using a remotely-located ground contact, with an inductive wirebond connecting the grounding electrode to the ground contact.
Figure 7:
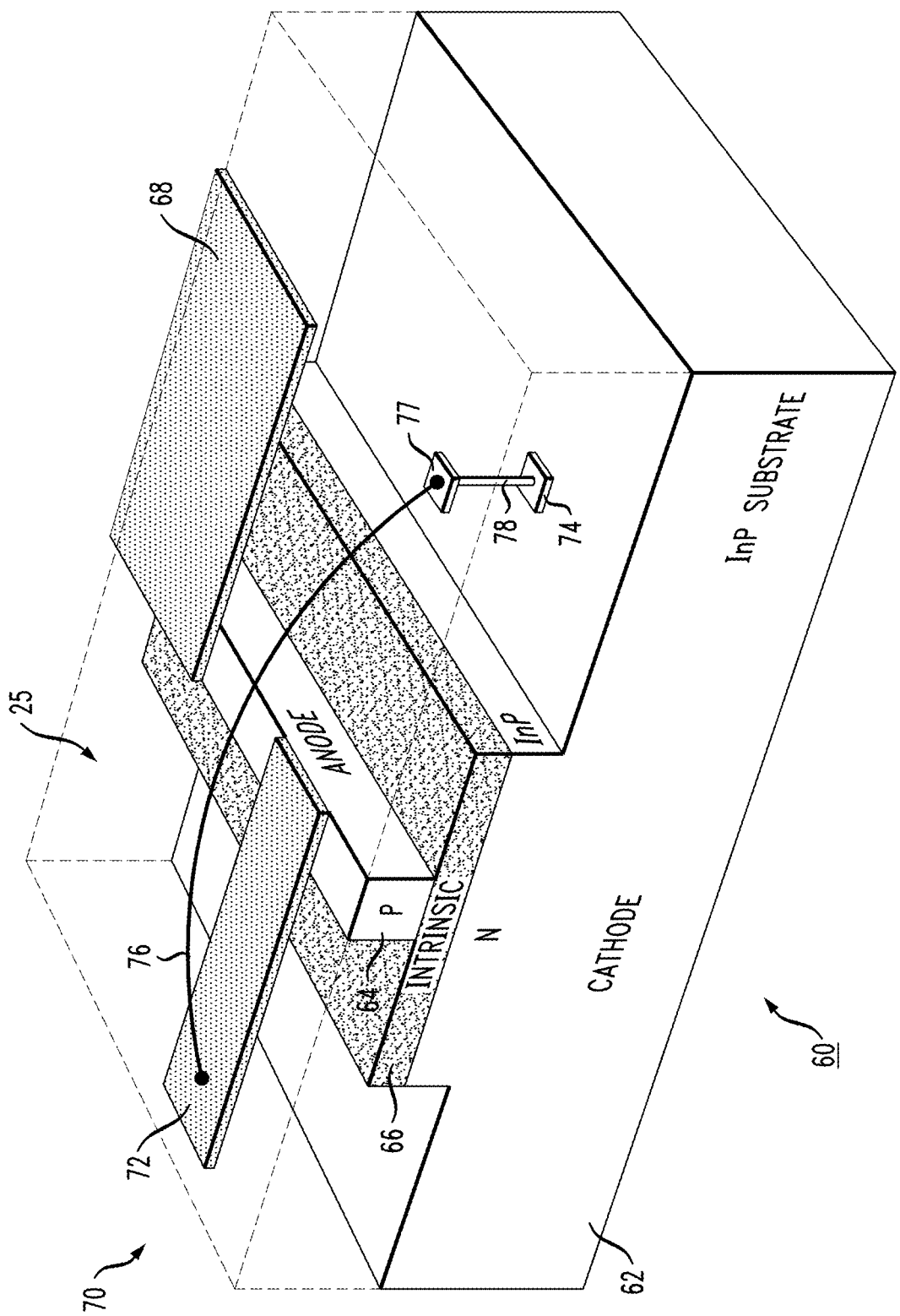
FIG. 7 is an isometric view of an exemplary configuration of the embodiment of FIG. 6.

FIGS. 6 and 7 illustrate an embodiment of the present invention where such an inductive element is included to extend the modulation bandwidth on the high frequency end of its bandwidth. In particular, FIG. 6 is a diagram of an exemplary shielded EAM 60 of the present invention, with FIG. 7 being an isometric view of shielded EAM 60. Again, the electro-absorption elements of EAM 60 are similar to those discussed above, including an n-type InP substrate 62 (functioning as the cathode), a p-type InP ridge 64 (functioning as the anode), and an active region 66 disposed between the n- and p-type layers 62 and 64, respectively. A modulator electrode 68 is shown as supplying the incoming electrical data signal, which in this embodiment is considered to include a significant high-frequency component.

A ground shield 70 is shown here as including a grounding electrode 72 and associated grounding termination 73. In this embodiment, grounding termination 73 takes the form of a ground contact pad 74 located somewhat remotely from grounding electrode 72, with a wirebond 76 forming an inductive connection between grounding electrode 72 and ground contact pad 74. As with the above-described embodiments, grounding electrode 72 is disposed on p-type InP ridge 64 at a location spaced apart from modulator electrode 68.

In contrast to the above embodiments and as best illustrated in FIG. 7, ground contact pad 74 is positioned at a relatively remote location on n-type InP substrate 62 with respect to the location of grounding electrode 72 on ridge 64, necessitating the use of a relatively long span wirebond 76 to complete the connection. In the particular arrangement shown in the isometric view of FIG. 7, wirebond 76 terminates on an elevated contact pad 77 formed on the surface of protective dielectric material 25. A conductive via 78 (such as a gold pillar, for example) is formed through dielectric 25 to connect contact pad 77 to ground contact pad 74. Since wirebond 76 behaves as an inductor at high frequencies, this particular type of connection functions to further limit the changes in effective length of the modulator's transmission line, providing efficient enhancement that mitigates the conventional roll-off typically found in the frequency response of prior art EAMs.

Figure 8:
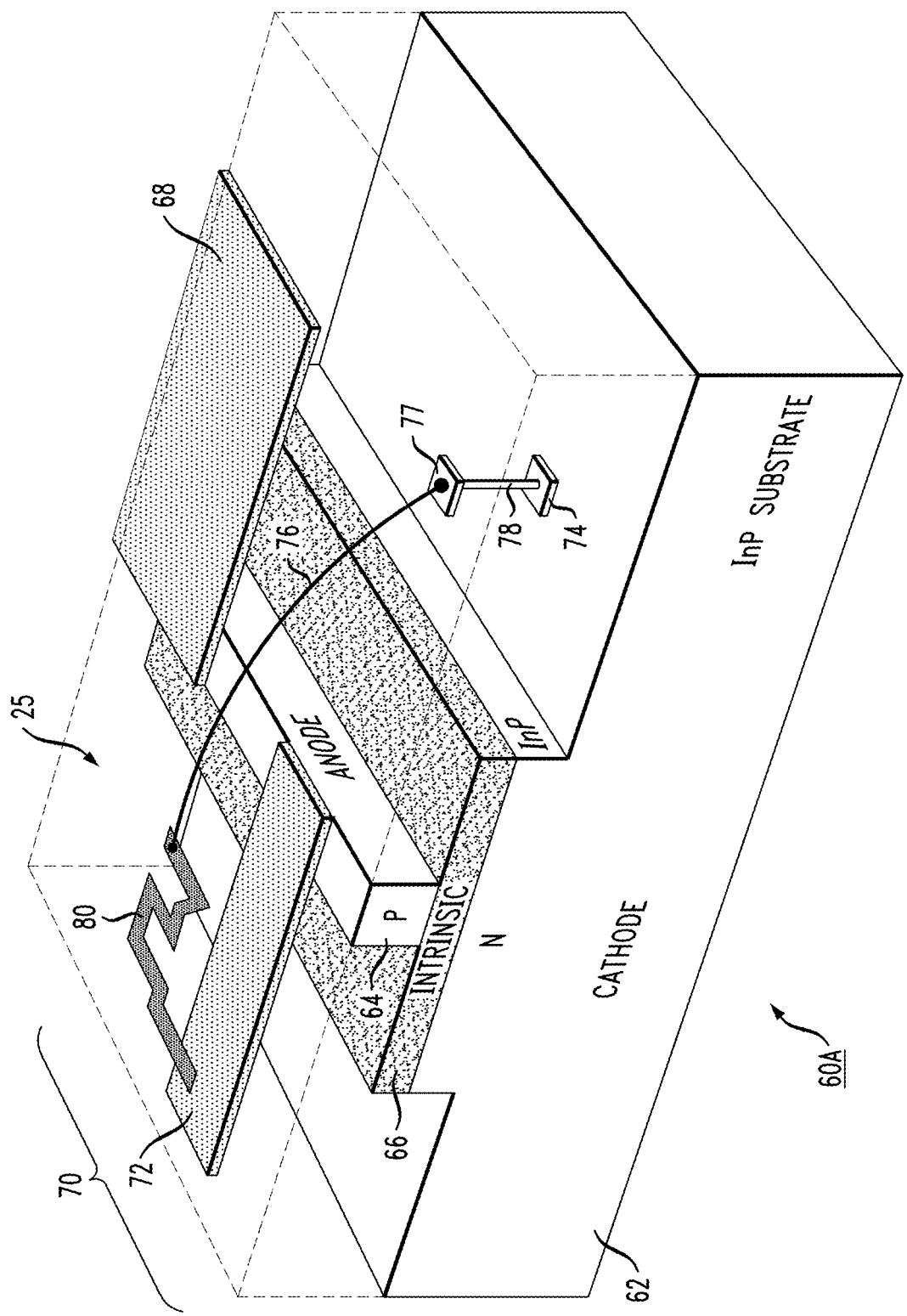
FIG. 8 is an isometric view of another configuration of the embodiment of FIG. 6, in this case including a microstrip inductive element in the path between the grounding electrode and the ground contact.

Other wirebond configurations may be used to form an inductive element within the inventive ground shield structure. FIG. 8 is an isometric view of an alternative EAM 60A, which utilizes a meandering microstrip 80 in combination with wirebond 76 to form an inductive element between grounding electrode 72 and contact pad 74.

For most applications, it is preferred to place the grounding electrode as close to an end termination of the modulator electrode as possible (within semiconductor fabrication process limits), where an exemplary spacing may be on the order of about 20 μm or so. While limited by fabrication tolerances, the spacing needs also to take into consideration the (unwanted) DC surface current that will flow between the modulator electrode and the grounding electrode in the presence of an RF signal applied to the modulator electrode. Since a conventional EAM functions in reverse-bias mode, a negative voltage applied to the modulator electrode creates a DC current flow between the modulator electrode and the grounding electrode (referred to at times as a "leakage current"). This DC current does not impact high speed operation of the EAM, but is a source of background heating and power dissipation that may become problematic in situations with a limited power budget and thermal limit. As a result, the thermal and power dissipation results can be lessened by increasing the spacing between the grounding electrode and the modulator electrode, but at the expense of allowing for a larger spread of voltage away from the modulator electrode. Other factors that influence the presence of this leakage current and related power dissipation are the electrical conductivity of the InP material itself, as well as the cross-sectional dimensions of the p-type InP ridge structure, where these factors are often "fixed" and not available for modification by the user. Accordingly, it is highly advantageous for power dissipation purposes to consider embodiments where the ground shield is not directly connected to a fixed DC ground level, but rather to an AC ground that is achieved by a capacitor. The embodiments described hereinbelow with respect to FIGS. 9 and 10 utilize such an AC ground configuration.

As briefly mentioned above, a ground shield formed in accordance with the present invention may utilize either an on-chip grounding termination or an off-chip grounding termination. The various embodiments described thus far may be characterized as using an on-chip grounding termination, specifically coupling grounding electrode 22 to the DC ground provided by n-type substrate 12.

Figure 9:
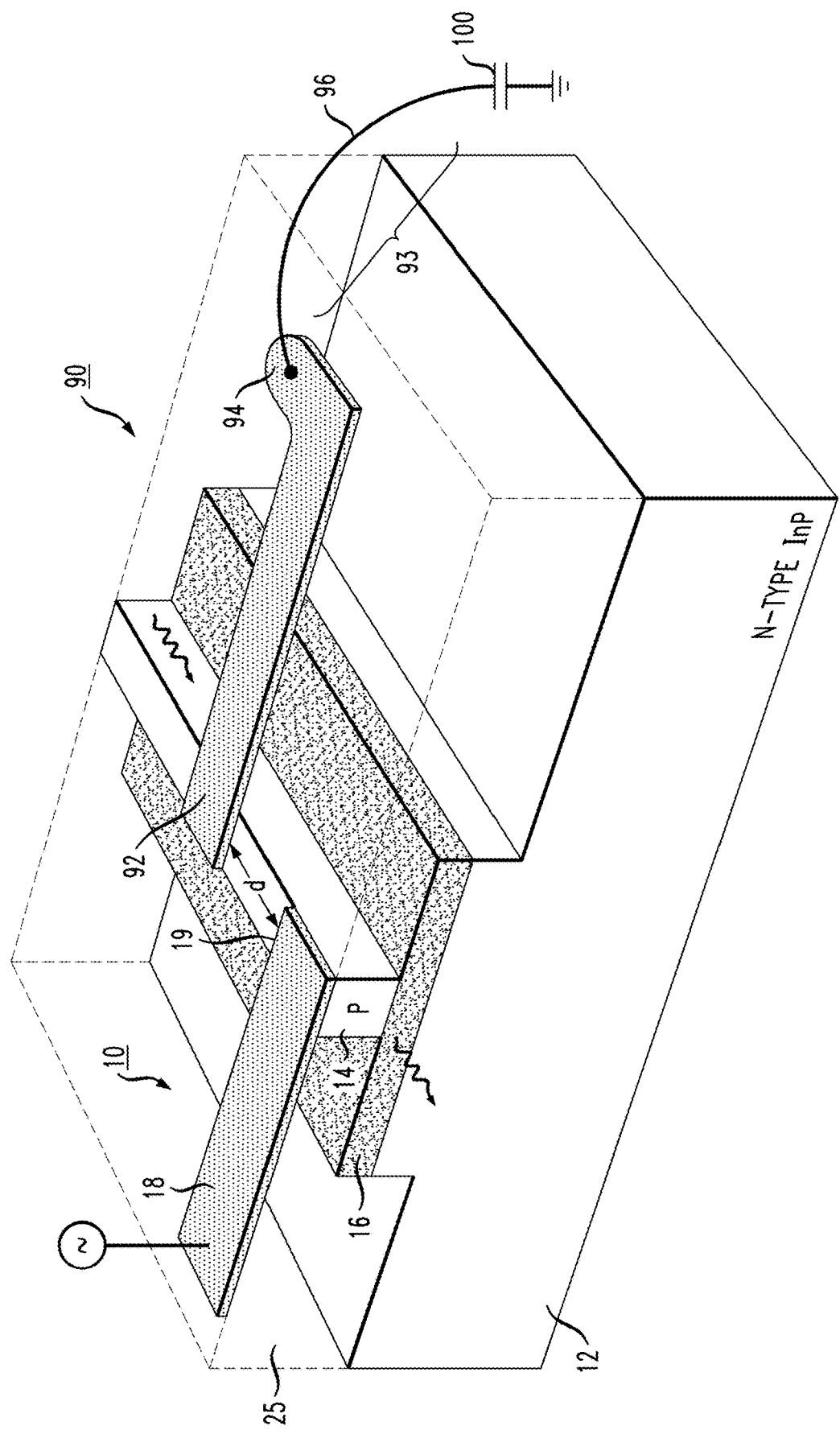
FIG. 9 is an isometric view of an exemplary off-chip ground termination embodiment of the present invention, using an off-chip capacitor to provide grounding, with a wirebond connecting the grounding electrode to the off-chip capacitor.

FIG. 9 illustrates an alternative embodiment of the present invention, in the form of a ground shield that utilizes an "off-chip" grounding termination (also referred to as a "virtual ground"), where the grounding electrode terminates in a manner that is contemplated as having the additional benefit of reducing the level of DC leakage current discussed above. In particular, FIG. 9 illustrates a ground shield 90 that includes a grounding electrode 92 disposed in relatively close proximity to end termination 19 of modulator electrode 18 (in the same manner as discussed above). As shown, grounding electrode 92 terminates at a bond pad 94.

In accordance with this virtual ground embodiment of the present invention, ground shield 90 includes a grounding termination 93 comprising a wirebond 96 that is used as shown to provide a connection between grounding electrode 92 and an off-chip capacitor 100. For the purposes of the present invention, off-chip capacitor 100 should have a relatively large capacitive value (e.g., typically 30 nF or more). Wirebond 96 exhibits inductive properties in the same manner as described above, and in this embodiment should have a length no greater than about 500 μm. This arrangement will advantageously flatten the portion of the modulator's frequency response in the range from about 0 to 10 GHz.

Figure 10:
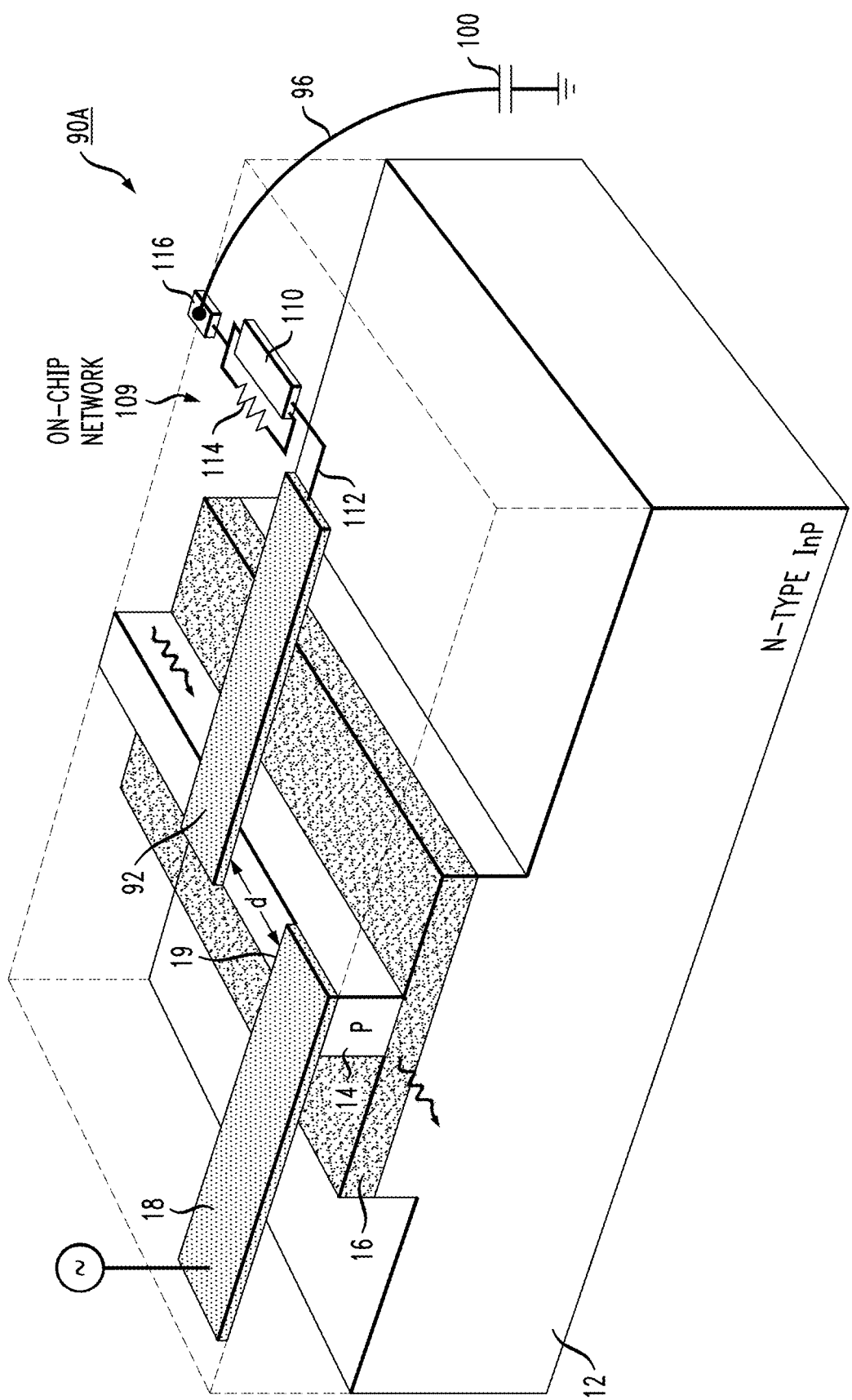
FIG. 10 is an isometric view of an alternative configuration for the embodiment of FIG. 9, in this case including an on-chip RC network between the grounding electrode and the off-chip capacitor.

FIG. 10 shows a variation of the embodiment of FIG. 9, in this case utilizing a ground shield 90A that further includes an on-chip RC network 109 that is used in combination with off-chip capacitor 100 to provide additional improvement to the frequency response of EAM 10. In particular, a small on-chip capacitor 110 (having a value in the range of about 30-100 pF) is directly connected to grounding electrode 92 (for example, using a micros trip 112). A small-valued resistor 114 (about 2Ω) is also disposed as an on-chip element, connected in parallel with on-chip capacitor 110 to form on-chip RC network 109. A bond pad 116 is disposed at the termination of resistor 114, with wirebond 96 again providing the connection to off-chip (larger) capacitor 100. The RC network added in this configuration provides an improved frequency response over the simple use of only the off-chip capacitor and while not explicitly illustrated, other RC network configurations may be used to tailor the frequency response, albeit at the cost of adding complexity to the fabrication of the EML.

With respect to the embodiments of FIGS. 9 and 10, off-chip capacitor 100 behaves like a short circuit to ground for high frequency signals, but exhibits a large resistive (blocking) function for DC current flow. Thus, the presence of the capacitor at high frequencies minimizes the migration of the applied voltage in a manner similar to the DC grounding described above.

Advantageously, the use of this type of capacitive ground shield has been found to minimize the DC leakage currents present in the integrated combination of an exemplary EAM/ground shield and a laser source (i.e., a first DC leakage current that exists between the laser and the modulator, and a second DC leakage current between the modulator and the ground shield), where these currents flow between the bias voltages of the devices and their ground terminals. The presence of a capacitor within the ground termination acts as a current block to DC current. Diminished leakage currents entail a reduction of wasteful power dissipation during operation of the chip.

Additionally, the elimination of a direct grounding to the on-chip DC ground allows for the quality of the laser and modulator diodes to be assessed simply and inexpensively during manufacture (as well as any time post-manufacture). That is, in the absence of a DC ground connection, the laser or modulator diode (or both) can be reverse biased for testing purposes. If the diodes are properly manufactured, the reverse leakage currents exhibit levels that correspond to the MΩ resistive properties of these diodes. However, for cases including a ground shield that is coupled to DC ground (such as shown in FIGS. 3-8), the application of a reverse bias causes leakage currents corresponding to an apparent diode blocking resistance of only kΩ levels; that is, approximately three orders of magnitude higher leakage currents than "normal". Said another way, the leakage currents to ground contact overwhelms the true diode reverse leakage characteristic of the diode structure itself. These much higher leakage currents may therefore complicate attempts to assess the laser or modulator diodes for possible manufacturing defects.

Figure 11:
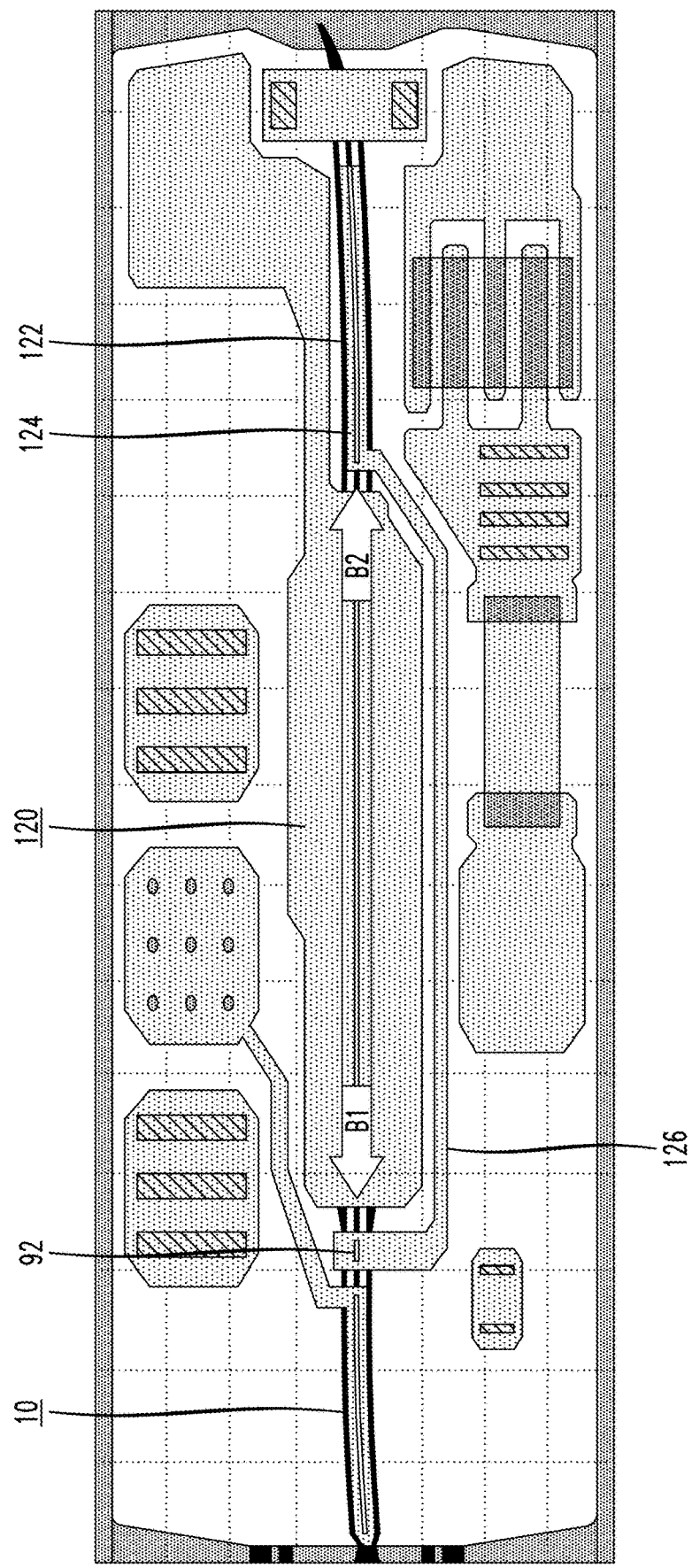
FIG. 11 is a top view of an exemplary integrated electro-absorption modulated laser (EML) using the inventive shielded EAM of the present invention in combination with a phase-shifted DFB, together configured to achieve an embodiment where a photo-resistor-based connection from the ground shield to an equivalent ground level created beyond the rear termination of the phase-shifted DFB is utilized.

A particular embodiment of the present invention that is well-suited for use with a phase-shifted distributed feedback (DFB) laser as its integrated light source is shown in FIG. 11, which is a top view of an electro-absorption modulated laser (EML) having both the light source and modulator formed on a common substrate. A phase-shifted DFB 120 is shown in FIG. 11 as disposed in relation to EAM 10 and used as the input optical source for EAM 10.

When incorporating with an EAM as described above with any type of laser source that does not utilize a reflective chip end facet termination, it is possible to provide an additional length of the gain active region material beyond the rear termination of the laser (that is, the termination on the side of the laser opposite to the location of the EAM). Exemplary of this type of laser source is a phase-shifted DFB (as discussed above), or a distributed Bragg reflector (DBR) laser, etched slot laser, or a laser having a reflection provided by a photonic crystal structure. For the purposes of discussion, the use of a phase-shifted DBR will be presumed, where an additional length of the gain active region is shown as an element 122 in FIG. 11, positioned "behind" phase-shifted DFB 120. Like phase-shifted DFB laser 120 itself, element 122 comprises a p-doped InP layer and an anode contact layer disposed above it, along with its own distinct photo-resistor electrode 124. A photo-resistor is understood to be a length of diode, which, in reverse bias, generates a photocurrent substantially proportional to incoming light intensity such that, when illuminated, this length of diode behaves somewhat like a resistor when viewed at the reverse-biased anode terminal.

When phase-shifted DFB laser 120 is energized, two separate CW optical beams are generated (as shown by the over-sized arrows in FIG. 11), with a first CW beam B1 directed into EAM 10 and used as the basis for the modulated optical output in the manner described above. A second CW beam B2 is directed into element 122, which functions here as a photo-resistor; specifically, its effective electrical resistance to ground is drastically reduced when the laser is operational and injecting light (CW beam B2) into photo-resistor element 122. As further shown in FIG. 11, grounding electrode 92 is connected to photo-resistor electrode 124 via a surface metallized connector 126.

The reaction of absorbed photocurrent at photo-resistor electrode 124 in response to any RF voltage swing that arrives from grounding electrode 92 provides a low resistance path to ground and, as such, provides a way to dissipate the RF energy over a broad range of RF frequencies, similar to the operation of the short circuit to ground that is provided by the ground shield embodiments that have been described in detail earlier, such that the desired flattening of the modulator frequency response will be achieved.

As with the off-chip capacitor embodiments, the arrangement shown in FIG. 11 allows for in-manufacture testing of the laser and modulator diode structures under reverse-bias conditions. In particular, photo-resistor element 122 only provides relatively low resistance when the laser is operating. When the laser is off, the photo-resistor acts as an open circuit, having MS) of resistance in reverse bias, allowing for the laser and modulator diode junction quality to be properly assessed.

FIG. 11 illustrates a preferred arrangement of a contacted gain section behind the laser to serve as a photo-resistor, which is particularly straightforward to integrate during the fabrication of a phase-shifted DFB laser, or any of the other type of laser as mentioned above that does not use a reflective end termination. However, it is to be understood that any other light source, including those that do employ a reflective end facet termination, may be utilized in combination with a photo-resistor to form a low resistance path to ground and mitigate the spread of the applied AC voltage of the modulator input beyond the end terminations of modulator electrode 18, while also enabling laser or modulator diode quality testing when the laser is off.

Figure 12:
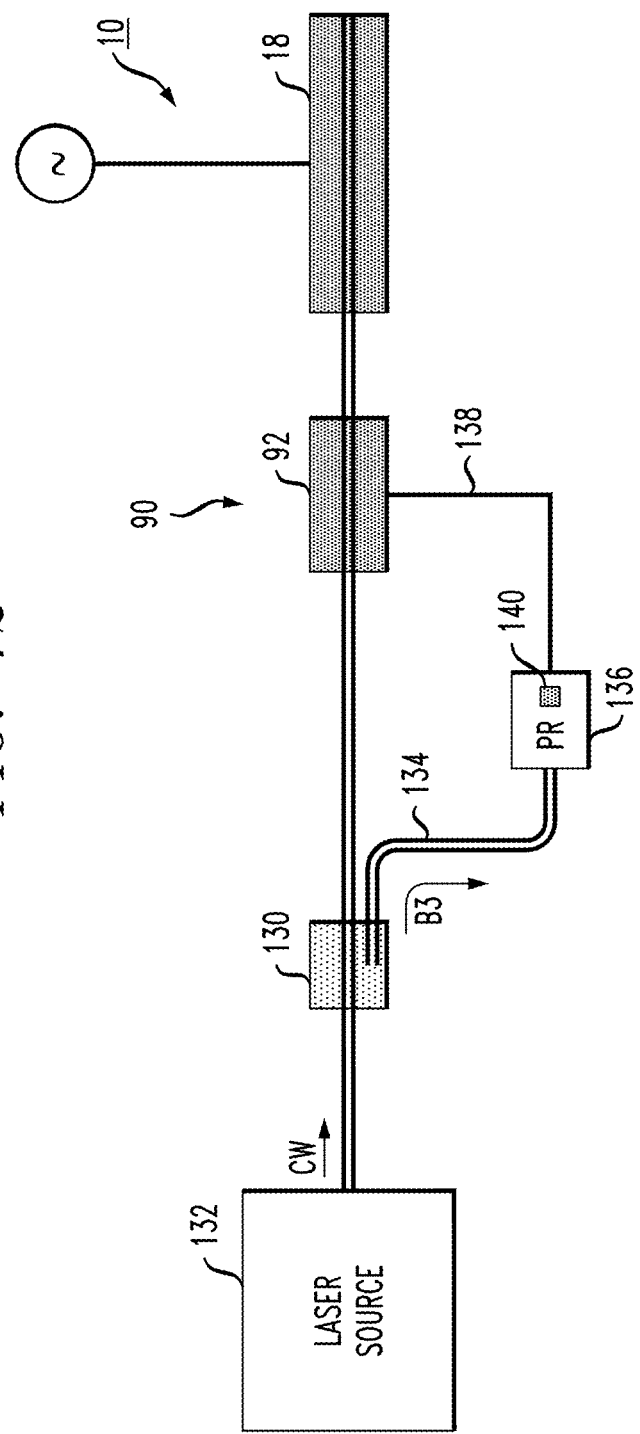
FIG. 12 is a block diagram of an alternative configuration of the embodiment of FIG. 11, where in this case a conventional laser source is used and the photo-resistor based connection is created via an optical tap off of the front emitting output port of the laser.

For example, as shown in the block diagram of FIG. 12, a waveguide splitter 130 may be used to tap off a portion of the light that is emitted from the front endface of a laser source 132 (denoted as CW beam B3). A section of optical waveguide 134 is included in this arrangement and used to direct out-coupled beam B3 to a photo-resistor 136 that is located on the EML chip along with EAM 10 and laser source 120. In a preferred embodiment, photo-resistor 136 is fabricated out of the same gain active region layer material that is used to form laser source 120.

A separate electrical path 138 is used in this arrangement to provide a ground termination path between grounding electrode 92 of ground shield 90 and an electrode 140 of photo-resistor 136. The arrangement as depicted in FIG. 12 thus functions in the same manner as that of FIG. 11; that is, the reaction of absorbed photocurrent at photo-resistor electrode 140 in response to any RF voltage swing that arrives from grounding electrode 92 provides a low resistance path to ground and, as such, provides a way to dissipate the RF energy over a broad range of RF frequencies. In accordance with the principles of the present invention as depicted in this FIG. 12 embodiment, a photo-resistor may be used in a configuration that uses a conventional laser source with a reflective end termination, since the front emitting surface is used to illuminate the photo-resistor.

While the principles of the present invention have been particularly shown and described with respect to illustrative and preferred embodiments, it will be understood by those skilled in the art that the foregoing and other changes in form and details may be made therein without departing from the spirit and scope of the invention, which should be limited only by the scope of the claims appended hereto.

What is claimed is:

1. A wideband electro-absorption optical modulating device comprising
    a substrate of a first conductivity type, the substrate defined as comprising a top major surface;
    an electro-absorption modulating device formed along a longitudinal extent of the substrate, the electro-absorption modulating device including an active region and an upper cladding layer of a second conductivity type disposed over the active region, the active region configured to receive an incoming continuous wave (CW) optical beam and generate an optically modulated output signal therefrom;
    a modulator electrode disposed over an extended portion of a top surface of the upper cladding layer and responsive to the application of an AC voltage-based input modulating signal to impart modulations to the propagating CW optical beam so as to create the optically modulated output signal, the modulator electrode defined as having a first end termination and a second end termination in opposition thereto; and
    a ground shield comprising
        a grounding electrode disposed in proximity to, yet separated from the first end termination of the modulator electrode, and
        a grounding termination element disposed between the grounding electrode and a ground plane, the grounding termination element including
            a ground contact disposed on the top major surface of the substrate at a position remote from the grounding electrode, and
            a conductive connection disposed between the grounding electrode and the ground contact and comprising a contact pad disposed in a planar relationship with the grounding electrode and positioned above the ground contact, a wirebond connecting the grounding electrode to the contact pad, and a conductive via connecting the contact pad to the ground contact,
        the ground shield reducing migration of the applied AC voltage beyond the first end termination of the modulator electrode, the ground shield maintaining a constant effective length of the electro-absorption modulating device regardless of a frequency of the input modulating signal.

2. The wideband electro-absorption optical modulating device as defined in claim 1 wherein the grounding termination element comprises
    an off-chip capacitor; and
    an inductive wirebond connected between the grounding electrode and the off-chip capacitor.

3. The wideband electro-absorption optical modulating device as defined in claim 2 wherein the grounding termination element further comprises an on-chip RC network disposed between the grounding electrode and the inductive wirebond.

4. The wideband electro-absorption optical modulating device as defined in claim 1 wherein
    the ground contact is located on the top major surface of the substrate at a position underneath the grounding electrode; and
    the conductive connection comprises a conductive via extending between the grounding electrode and the ground contact.

5. The wideband electro-absorption optical modulating device as defined in claim 1 wherein
    the ground contact is located on the top major surface of the substrate at a position remote from the grounding electrode; and
    the conductive connection comprises a wirebond extending between the grounding electrode and the ground contact.

6. The wideband electro-absorption optical modulating device as defined in claim 1 wherein the conductive connection further comprises a stripline inductor disposed along a portion of the path between the grounding electrode and the contact pad.

7. The wideband electro-absorption optical modulating device as defined in claim 1, further comprising
    an additional ground shield disposed in proximity to, yet separated from a second, opposing end termination of the modulator electrode and coupled to a ground plane, the additional ground shield reducing migration of the applied AC voltage beyond the second, opposing end termination of the modulator electrode.

8. An electro-absorption modulated laser comprising
    a laser source for emitting a CW optical beam from at least a front facet thereof;
    a photo-resistor formed on a common substrate with the laser source and disposed to receive a portion the emitted CW optical beam; and
    an electro-absorption optical modulating device formed on a common substrate with the laser source and disposed to receive as an input the emitted CW optical beam and generate therefrom a modulated optical output signal, the electro-absorption optical modulating device comprising
        an active region and an upper cladding layer disposed over the active region, the active region configured to receive the CW optical beam;
        a modulator electrode disposed over an extended portion of the upper cladding layer and responsive to the application of an AC voltage-based input modulating signal to impart modulations to the propagating CW optical beam so as to create the optically modulated output signal, the modulator electrode defined as having a first end termination and a second end termination in opposition thereto; and
        a ground shield comprising a grounding electrode disposed adjacent to an end termination of the modulator electrode and a grounding termination coupled between the grounding electrode and a surface electrode of the photo-resistor.

9. The electro-absorption modulated laser as defined in claim 8 wherein
    the laser source comprises a phase-shifted distributed feedback laser, emitting a first CW optical beam from a front facet thereof and directed into the electro-absorption modulating device, and emitting a second CW optical beam from a rear facet thereof; and
    the photo-resistor is disposed behind the rear facet for receiving the second CW optical beam, where the photo-resistor comprises a continued longitudinal extent of the laser active region with the photo-resistor surface electrode disposed on the active region.

10. The electro-absorption modulated laser as defined in claim 8 wherein the laser further comprises
    an optical tap disposed between a front facet of the laser source and the ground shield, the optical tap for direction a portion of the CW optical beam emitted from the laser source into the active region of the photo-resistor.

11. The electro-absorption modulated laser as defined in claim 8 wherein the laser further comprises an optical tap disposed between a front facet of the laser source and the photo-resistor, the optical tap for direction a portion of the CW optical beam emitted from the laser source into the active region of the photo-resistor.

* * * * *